(12) United States Patent
Roos et al.

(10) Patent No.: US 7,002,408 B2
(45) Date of Patent: Feb. 21, 2006

(54) DATA SIGNAL AMPLIFIER AND PROCESSOR WITH MULTIPLE SIGNAL GAINS FOR INCREASED DYNAMIC SIGNAL RANGE

(75) Inventors: Pieter Gerhard Roos, Santa Clara, CA (US); Edward Seppi, San Mateo, CA (US); Richard Colbeth, Santa Clara, CA (US); Gary Virshup, Santa Clara, CA (US); Ivan Petrov Mollov, Santa Clara, CA (US)

(73) Assignee: Varian Medical Systems Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/685,787

(22) Filed: Oct. 15, 2003

(65) Prior Publication Data
US 2005/0083120 A1 Apr. 21, 2005

(51) Int. Cl.
*H03F 1/36* (2006.01)
(52) U.S. Cl. .............................. 330/86; 330/9; 330/282
(58) Field of Classification Search ...................... None
See application file for complete search history.

(56) References Cited

U.S. PATENT DOCUMENTS 4,739,307 A * 4/1988 Marcovici et al. ............ 330/86
5,760,723 A 6/1998 McGrath et al.
6,486,808 B1 * 11/2002 Seppi et al. ................. 341/139
6,587,143 B1 * 7/2003 Boisvert ...................... 348/241
6,661,283 B1 * 12/2003 Lee .............................. 330/9
6,791,378 B1 * 9/2004 Rossi ........................... 330/9
6,853,241 B1 * 2/2005 Fujimoto ...................... 330/9

* cited by examiner

*Primary Examiner*—Khanh V. Nguyen
(74) *Attorney, Agent, or Firm*—Vedder Price Kaufman & Kammholz, P.C.

(57) ABSTRACT

Data signal amplification and processing circuitry with multiple signal gains for increasing dynamic signal range. An incoming data signal is processed in accordance with multiple signal gains. The resultant signals have multiple signal values which are compared to predetermined lower and higher thresholds. The desired output signal is: the maximum sample signal value when the maximum value fails to traverse a predetermined lower threshold; the minimum sample signal value when an adjacent larger one of the plurality of sample signal values traverses a predetermined higher threshold; a smaller of mutually adjacent ones of a pair of the plurality of sample signal values when a larger one of the pair of sample signal values traverses the predetermined higher threshold and the smaller value fails to traverse the predetermined lower threshold; and a combination of the smaller and larger ones of the pair of sample signal values when the larger value traverses the predetermined lower threshold and fails to traverse the predetermined higher threshold.

54 Claims, 5 Drawing Sheets

DATA SIGNAL AMPLIFIER AND PROCESSOR WITH MULTIPLE SIGNAL GAINS FOR INCREASED DYNAMIC SIGNAL RANGE

BACKGROUND OF THE INVENTION

1. Field of the Invention

The present invention relates to analog amplifiers for pre-amplifying low level charge-based signals, and in particular, to amplifier and processor circuits with analog pre-amplifier circuits and analog-to-digital (ADC) conversion circuits.

2. Description of the Related Art

High dynamic signal range is a key parameter for many types of circuits. This is particularly true in the area of flat panel x-ray imaging systems. As is well known in the art, such systems use a detector cassette containing a scintillation layer that absorbs and converts impinging x-ray photons to visible light photons for detection by photosensitive elements that are also within the detector array. As is further well known, such a detector array contains a two dimensional array of microscopic squares referred to as picture elements, or "pixels". Each pixel includes an addressable photosensitive element, such as a photodiode and switching transistor combination. From such circuitry individual pixel data signals, generally in the form of charge based signals, are provided for amplification and further processing. (Further discussion of this type of imaging system can be found in U.S. Pat. No. 5,970,115, entitled "Multiple Mode Digital X-Ray Imaging System", the disclosure of which is incorporated herein by reference.)

Present methods of reading out image pixel information from such flat panel detector arrays involves linear conversion of the electrical charge of each pixel to a voltage. Such voltage is then processed linearly and converted to a digital value using a conventional analog-to-digital converter (ADC). Both processes have inherent limitations, however. The process of linear charge-to-voltage conversion and amplification will have limitations due to noise, linearity issues and limited signal saturation levels. The digital conversion process has a limitation on dynamic range, which presently is typically at 14 bits. (Converters capable of more than 14-bit conversion at speeds required for flat panel imaging arrays have limited, if any, availability as commercial products.)

Improvement of the dynamic range of the linear conversion process has been described in U.S. Pat. No. 6,486,808, entitled "Data Signal Amplifier With Automatically Controllable Dynamic Signal Range" (the disclosure of which is incorporated herein by reference). Such a technique involves automatic switching of the charge-to-voltage gain factor to a lower value when pixels with high signal levels are encountered. Pixel values corresponding to these dynamically reduced gain values are identified (e.g., flagged with an additional bit) such that downstream image processing circuitry can detect such pixel values and correct for the reduced gain factor. This allows signal values large enough to otherwise cause saturation of the charge-to-voltage converter, the signal processing path or the ADC to be "compressed", converted to appropriate digital data and subsequently expanded, or "decompressed", thereby extending the dynamic range of signals for conversion.

Compensation or improvement of the digital conversion portion of the processing is disclosed in U.S. Pat. No. 5,760,723, entitled "Delta-Sigma Analog-To-Digital Converter Including Charge Coupled With Devices" (the disclosure of which is incorporated herein by reference).

Extending the dynamic range of the charge-to-voltage conversion, particularly those used in present flat panel imaging arrays, is problematic. Significant limitations exist due to electronic noise and non-ideal and non-linear behavior of electronic components. As for the digital conversion, increasing bit depth of an ADC results in significant additional system cost and power dissipation. Further, ADCs capable of more than 14-bit conversion at the requisite speeds are not readily available as commercial products.

While the dynamic gain switching technique of U.S. Pat. No. 6,486,808 succeeds in extending the dynamic range without increasing physical complexity, cost or power dissipation, correction of the compressed pixel values requires precise information concerning the transfer functions of the signal processing electronics in both standard and reduced gain modes. The binary nature of the gain switching decision along with imperfect restoration of low gain pixel values can produce contour artifacts in image regions where the pixel values cross over the gain switching threshold. Moreover, implementation of this technique requires more complex circuitry which is generally less flexible in terms of being adapted to revised application requirements.

Regarding the digital conversion process, extending the dynamic range at extremely low signal levels is very difficult, and generally requires development and use of significantly more complex circuits which are directed to specific product implementations or system requirements and not readily adaptable to revised application requirements. Further, practical implementation is often precluded due to constraints on power dissipation and available space.

SUMMARY OF THE INVENTION

In accordance with the presently claimed invention, data signal amplification and processing circuitry uses multiple signal gains for increasing dynamic signal range. An incoming data signal is processed in accordance with multiple signal gains. The resultant signals have multiple signal values which are compared to predetermined lower and higher thresholds. The desired output signal is: the maximum sample signal value when the maximum value fails to traverse a predetermined lower threshold; the minimum sample signal value when an adjacent larger one of the plurality of sample signal values traverses a predetermined higher threshold; a smaller of mutually adjacent ones of a pair of the plurality of sample signal values when a larger one of the pair of sample signal values traverses the predetermined higher threshold and the smaller value fails to traverse the predetermined lower threshold; and a combination of the smaller and larger ones of the pair of sample signal values when the larger value traverses the predetermined lower threshold and fails to traverse the predetermined higher threshold.

In accordance with one embodiment of the presently claimed invention, data signal amplification and processing circuitry with multiple signal gains for increasing dynamic signal range includes a signal node, amplification circuitry, sampling circuitry and processing circuitry. The signal node is to convey an input signal having an input signal value. The amplification circuitry is coupled to the signal node, includes a variable signal gain responsive to at least one gain control signal having a plurality of values, and is responsive to the input signal by providing an intermediate signal having a plurality of values corresponding to the plurality of gain control signal values. The sampling circuitry is coupled to the amplification circuitry and responsive to a sampling control signal by sampling the intermediate signal to provide a sample signal having a plurality of values which include at least a maximum and a minimum, and correspond to the plurality of intermediate signal values. The processing circuitry is coupled to the sampling circuitry and responsive to one or more processing control signals by processing the sample signal to provide a processed signal having a value corresponding to the input signal value, wherein the processed signal value represents: the maximum sample signal value when the maximum value fails to traverse a predetermined lower threshold; the minimum sample signal value when an adjacent larger one of the plurality of sample signal values traverses a predetermined higher threshold; a smaller of mutually adjacent ones of a pair of the plurality of sample signal values when a larger one of the pair of sample signal values traverses the predetermined higher threshold and the smaller value fails to traverse the predetermined lower threshold; and a combination of the smaller and larger ones of the pair of sample signal values when the larger value traverses the predetermined lower threshold and fails to traverse the predetermined higher threshold.

In accordance with another embodiment of the presently claimed invention, data signal amplification and processing circuitry with multiple signal gains for increasing dynamic signal range includes amplifier means, sampling means and processor means. The amplifier means includes variable signal gain and is for receiving an input signal having an input signal value and at least one gain control signal having a plurality of values, and in response thereto generating an intermediate signal having a plurality of values corresponding to the plurality of gain control signal values. The sampling means is for receiving a sampling control signal and in response thereto sampling the intermediate signal and generating a sample signal having a plurality of values which include at least a maximum and a minimum, and correspond to the plurality of intermediate signal values. The processor means is for receiving one or more processing control signals and in response thereto processing the sample signal and generating a processed signal having a value corresponding to the input signal value, wherein the processed signal value represents: the maximum sample signal value when the maximum value fails to traverse a predetermined lower threshold; the minimum sample signal value when an adjacent larger one of the plurality of sample signal values traverses a predetermined higher threshold; a smaller of mutually adjacent ones of a pair of the plurality of sample signal values when a larger one of the pair of sample signal values traverses the predetermined higher threshold and the smaller value fails to traverse the predetermined lower threshold; and a combination of the smaller and larger ones of the pair of sample signal values when the larger value traverses the predetermined lower threshold and fails to traverse the predetermined higher threshold.

In accordance with still another embodiment of the presently claimed invention, a method of data signal amplification and processing with multiple signal gains for increasing dynamic signal range includes:

receiving an input signal having an input signal value;

receiving at least one gain control signal having a plurality of values;

generating, in response to the input signal and the at least one gain control signal, an intermediate signal having a plurality of values corresponding to the plurality of gain control signal values;

receiving a sampling control signal and in response thereto sampling the intermediate signal and generating a sample signal having a plurality of values which include at least a maximum and a minimum, and correspond to the plurality of intermediate signal values; and receiving one or more processing control signals and in response thereto processing the sample signal and generating a processed signal having a value corresponding to the input signal value, wherein the processed signal value represents the maximum sample signal value when the maximum value fails to traverse a predetermined lower threshold, the minimum sample signal value when an adjacent larger one of the plurality of sample signal values traverses a predetermined higher threshold, a smaller of mutually adjacent ones of a pair of the plurality of sample signal values when a larger one of the pair of sample signal values traverses the predetermined higher threshold and the smaller value fails to traverse the predetermined lower threshold, and a combination of the smaller and larger ones of the pair of sample signal values when the larger value traverses the predetermined lower threshold and fails to traverse the predetermined higher threshold.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

As will be discussed in more detail below, the presently claimed invention uses charge-to-voltage conversion in a pre-amplification stage with multiple selectable conversion factors, or gains, to achieve increased dynamic range in data signal acquisition. The charge of each pixel signal is read and converted to a voltage in a high gain mode of the pre-amplification stage, and then read and converted again in a lower gain mode. Both voltages are converted to corresponding digital values by common ADC circuitry, following which downstream signal processing circuitry rescales and combines, as appropriate, these digital values to produce a single pixel signal value.

Figure 1:
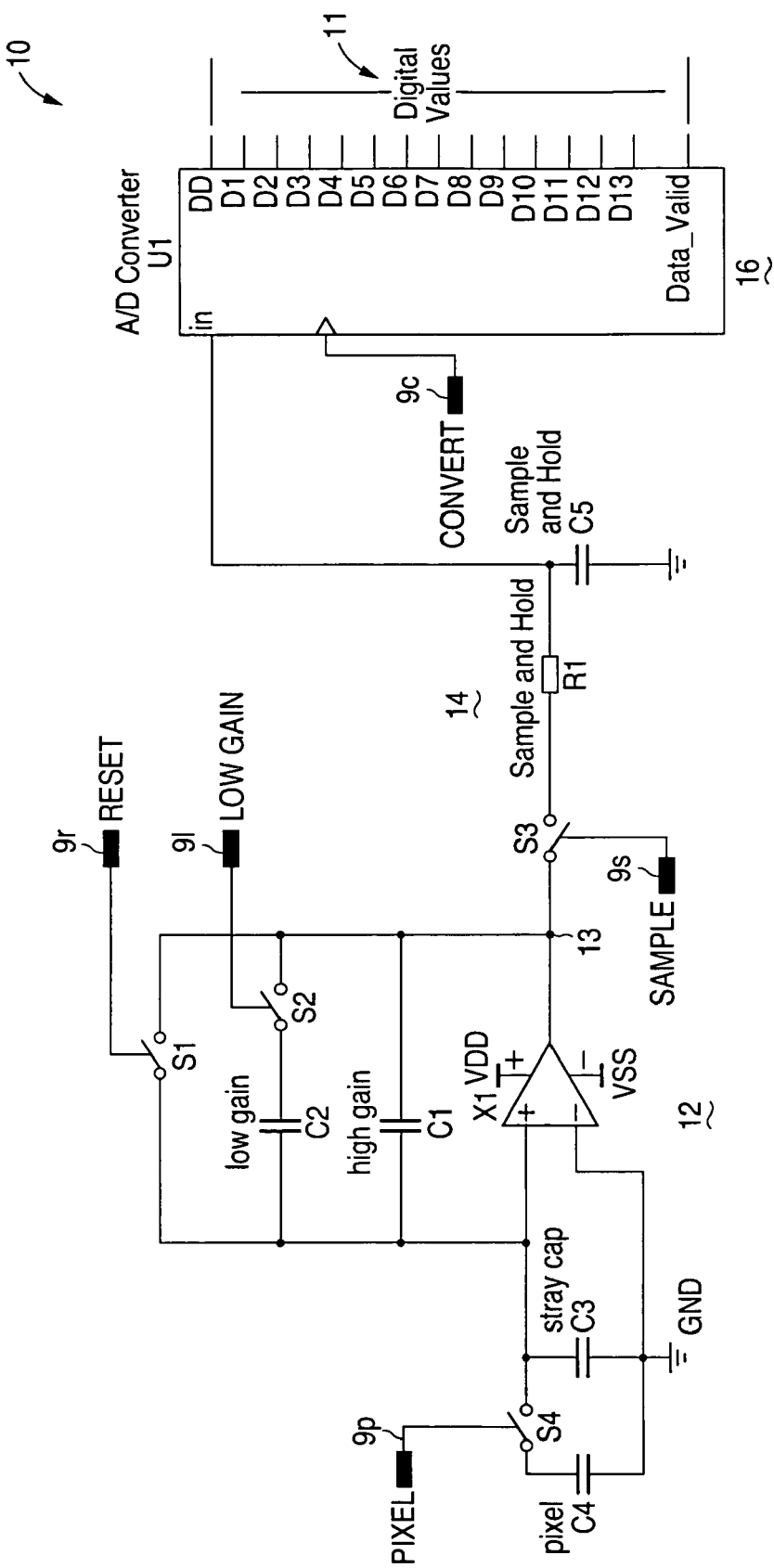
FIG. 1 is a schematic diagram of data signal amplification and processing circuitry with multiple signal gains for increasing dynamic signal range in accordance with one embodiment of the presently claimed invention.

Referring to FIG. 1, data signal amplification and processing circuitry 10 with multiple signal gains for increasing dynamic signal range in accordance with one embodiment of the presently claimed invention includes a linear amplifier stage 12, a sample and hold stage 14 and an ADC stage 16, all interconnected substantially as shown. The linear amplifier stage 12 includes a differential amplifier X1 and feedback capacitance circuitry including capacitors C1 and C2, and switches S1 and S2. In an integrated circuit environment, as is well known in the art, such switches S1, S2 are generally designed as pass transistors or transmission gates (dual pass transistors connected in parallel). Additionally, it will be understood that the primary feedback capacitor C1, instead of being a fixed capacitance, can be a variable capacitance (e.g., varactor) controlled by an additional gain control signal (not shown). Switch S1 is a reset switch which when closed, with switch S2 also closed, resets the circuit by discharging both capacitors C1, C2.

Input circuitry in the form of capacitors C3 and C4 are represented to identify any finite stray capacitance (C3) and capacitance C4 of the subject pixel for which electrical charge is being converted to a voltage.

The sample and hold circuitry 14 includes a serially coupled switch S3, a resistor R1 and a shunt capacitor C5. The ADC circuitry 16 includes an ADC U1 which converts the analog voltage across capacitor C5 to a digital signal 11, e.g., 14-bits wide.

Figure 2:
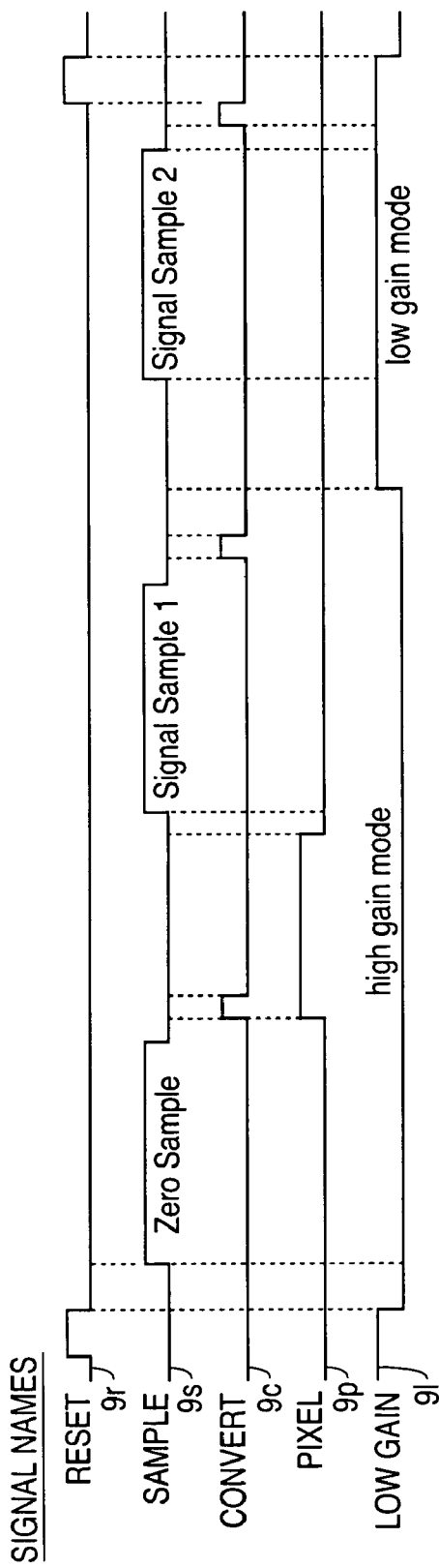
FIG. 2 is a signal timing diagram of timing and control signals for the circuit of FIG. 1.

Referring to FIG. 2, timing and operation of the circuitry of FIG. 1 can be better understood. Initially, the system is placed in a low gain mode by having signal 91 active (e.g., asserted) so that switch S2 is closed. The reset signal 9r is activated (e.g., asserted), thereby closing switch S1 and resetting the system by discharging the feedback capacitors C1, C2. Both switches S1, S2 are then opened and the system is operating in a high gain mode. Pixel signal 9p becomes active, thereby closing switch S4 (e.g., a thin film transistor (TFT)) and causing signal charge accumulated on the pixel capacitance C4 to be shared with the feedback capacitor C1 of the amplifier stage 12. The resulting voltage signal at the output 13 of the amplifier X1 is sampled by activating sample signal 9s, thereby closing switch S3 and causing shunt capacitor C5 to charge to the same voltage. Following that, the convert signal 9c is activated, thereby causing the voltage across capacitor C5 to be converted to its digital equivalent as a multi-bit digital signal 11.

As is typical, particularly in a flat panel imaging system readout sequence, a zero sample is acquired first, whereby the reset voltage at the output 13 of the amplifier 12, following reset (with the feedback capacitors C1, C2 discharged), is sampled and stored across the shunt sample and hold capacitor C5, following which the convert signal 9c causes such voltage (approximately, though not necessarily exactly, equal to zero) to be converted to its digital equivalent as a "zero" digital signal 11. As is well known in the art, as part of a correlated double sampling (CDS) process, such zero signal sample can be subtracted from later signal values acquired during high and low gain circuit operation (discussed in more detail below).

Next, the low gain control signal 91 is activated, thereby closing switch S2 and placing capacitor C2 in parallel with capacitor C1, and causing the amplifier stage 12 to operate in its low gain mode. The electrical charge initially transferred from the pixel capacitance C4 and stored on the high gain capacitor C1 is now shared between both feedback capacitors C1, C2, according to the ratio of their respective capacitance values. This results in a lower voltage across these capacitors together C1, C2, thereby also reducing the voltage at the output 13 of the amplifier stage 12. This lower voltage is sampled by the sample and hold circuit 14, following which the sampled voltage across shunt capacitor C5 is converted by the ADC U1 to its digital signal 11 counterpart.

Figure 3:
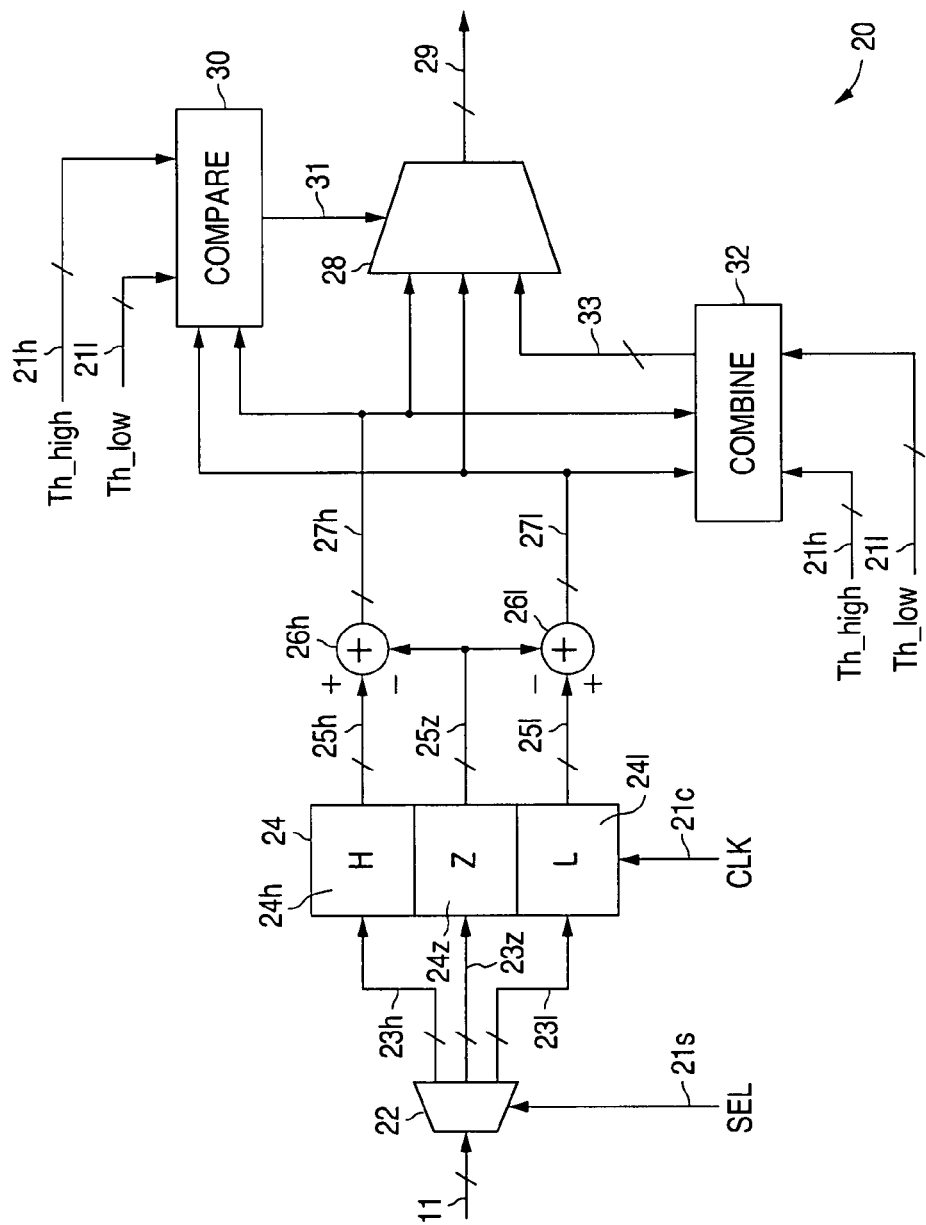
FIG. 3 is a functional block diagram of one example of processing circuitry suitable for use with the circuit of FIG. 1.

Referring to FIG. 3, subsequent processing of the digitized sample signal 11 uses the above-discussed three signal values, "zero" signal sample, high gain mode signal sample, and low gain mode signal sample, to construct a final pixel signal 29. As discussed in more detail below, the low gain pixel values are transformed to a set of equivalent high gain values. This is done by multiplication of the low gain pixel value by a transformation factor larger than unity. This can be considered as a form of decompression of the low gain pixel values to their equivalent high gain values. For those values where the actual high gain data are compromised due to electronic signal saturation, such digital values would be produced which are much larger than those which the actual high gain mode of operation is capable of producing.

Meanwhile, pixel data values acquired in the high gain mode are tested against a threshold value T that, a priori, is known to avoid saturation of the electronic components in the signal path during the high gain mode of operation. For those pixel data values where the high gain values are clearly below such threshold value T, the high gain values are used as the final pixel values. For those values where the high gain pixel values are clearly above such threshold value T, the transformed low gain values are used as the final pixel data values. For those values where the high gain pixel values are within a predetermined window about such threshold value T, e.g., between a lower threshold value Th_low and a higher threshold Th_high (where Th_low<T<Th_high), combinations (e.g., linear) of the high gain values and transformed low gain values are used to construct a combination, or composite, pixel data value.

Such comparison and ultimate use of one of three different possible pixel data values avoid image artifacts that may develop in the recombination process which might otherwise occur due to imperfect transformation of low gain values to equivalent high gain values.

As one possible example of performing this operation, the digitized pixel data 11 is multiplexed with a multiplexor 22 controlled by a select signal 21s for selective storage in a memory 24. The "zero" data 23z is stored in a "zero" data section 24z, the high gain mode data 23h is stored in a high gain mode section 24h and the low gain mode data 23l is stored in a low gain mode data section 24l. Some form of subtraction circuitry 26h, 26l is used to subtract the stored "zero" data 25z from the stored high 25h and low 25l gain mode data to produce (in accordance with conventional CDS techniques, as discussed above) corrected high 27h and low 27l gain mode pixel data.

These high 27h and low 27l gain mode pixel data are provided to a data comparison stage 30 and data combining stage 32, as well as to an output multiplexor 28. These data 27h, 27l are compared to the lower 21l and higher 21h threshold values, as discussed above (and in further detail below) to produce a multiplexor control signal 31 for the output multiplexor 28. These data 27h, 27l are also combined in the combining stage 32 as a function of the lower 21l and higher 21h threshold data values (discussed in more detail below) to produce a combined data signal 33. In accordance with the control signal 31, one of these data signals 27h, 27l, 33 is then selected as the final pixel data signal 29.

Figure 5A:
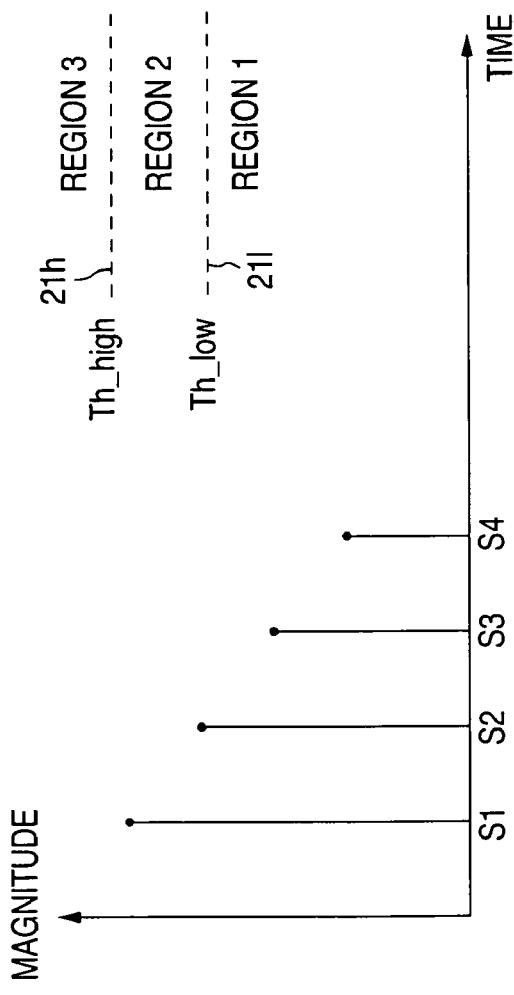
FIG. 5A is a graph depicting processing of more than two signal samples in accordance with the presently claimed invention.
Figure 4:
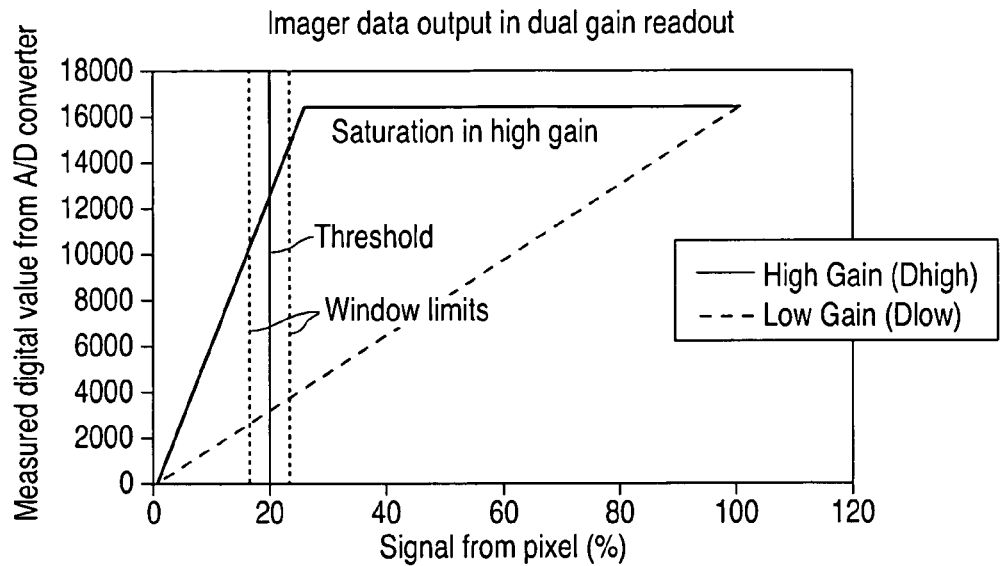
FIG. 4 is a graph of measured digital value versus analog input value for the circuit of FIG. 1.
Figure 5:
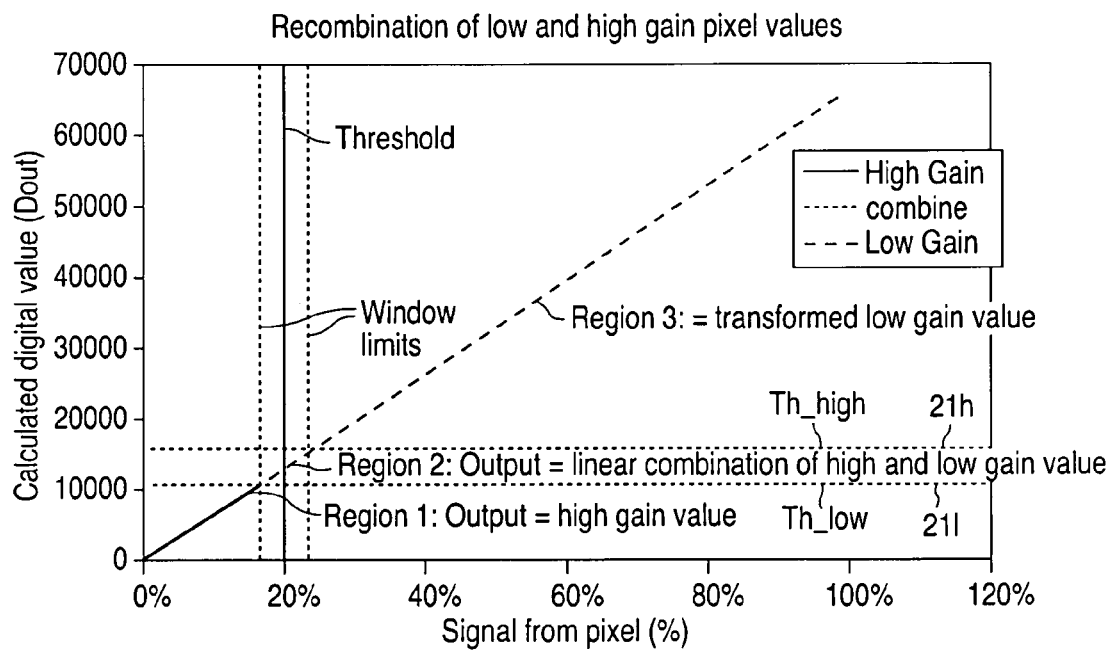
FIG. 5 is a graph of calculated digital value versus analog input value in accordance with the presently claimed invention.

Referring to FIGS. 4 and 5, operation of the circuitry of FIGS. 1 and 3 can be better understood. The graphs in these figures represent an example of an operating scenario where a 14-bit ADC converts the incoming pixel signal values such that the low gain mode of operation uses a gain which is ¼ of the gain used in the high gain mode of operation. Accordingly, reconstruction of the low gain values to their respective equivalent high gain values would require a simple multiplication by a factor (e.g., "gain ratio") of four. As seen in the figures, the recombination operates in three regions. In Region 1, the final pixel value will equal the pixel value acquired during the high gain mode of operation. In Region 3, the final pixel value will equal the pixel value acquired during the low gain mode of operation multiplied by the inverse (4) of the gain reduction factor (¼). In Region 2, i.e., the overlap region defined by the upper Th_high and lower Th_low boundaries, the final pixel value is calculated according to the following formula (in which linear signal measurements are assumed):

$$D_{out}=Gain\_Ratio*D\_low*((D_{high}-Th\_low)/(Th\_high-Th\_low))+D\_high*((Th\_high-D_{high})/(Th\_high-Th\_low))$$

where:
  Dout=final pixel value
  D_low=digital value acquired in low gain mode
  D_high=digital value acquired in high gain mode
  Gain_Ratio=ratio of high value reading to low value reading (=4 in present example)
  Th_low=threshold window lower limit
  Th_high=threshold window, upper limit.

Based upon the foregoing, a number of benefits of the presently claimed invention should be evident. At low pixel data signal values, data acquired at the higher resolution characteristic of the high gain mode of operation is used. Where the incoming pixel data signal values approach or exceed those corresponding to the saturation level of the signal processing path associated with the high gain mode of operation, data acquired at the low resolution characteristic of the low gain mode of operation is used, thereby avoiding image saturation. This is particularly advantageous in the context of x-ray image pixel data in that this technique according to the presently claimed invention complements the logarithmic nature of the x-ray image data typically acquired with flat panel imaging arrays. In those image regions with signal levels near the gain crossover point, the system, e.g., image processing computer, has the option of using an intelligent combination of the two values (due to high and low gain modes of operation) per pixel, thereby avoiding image artifacts that may otherwise result due to abrupt changes in pixel data signal gain.

In conformance with the foregoing discussion, it should be evident to one of ordinary skill in the art that adding additional capacitor and switch pairs and correspondingly increasing the acquisition cycle to three or more signal samples can increase the dynamic range of the circuitry even further by providing multiple selectable signal gain factors. Additionally, it will be understood that the combination algorithm, while discussed as being a linear interpolation of the low and high gain pixel values, can be more complex, e.g., quadratic or cubic spline interpolation methods, to account for effects from nonlinear signal measurements as well as other causes of inaccurate signal measurements. Additionally, for purposes of simplification, the "zero" data need not necessarily be used as otherwise suggested in the discussion above.

Referring to FIG. 5A, in accordance with the presently claimed invention, it will be understood that, as noted above, increasing the acquisition cycle to three or more signal samples, can potentially increase the dynamic range of the circuitry further by providing multiple selectable signal gain factors. In this example, the acquisition cycle uses four signal samples, thereby providing four sample signal values S1, S2, S3, S4. In conformance with the discussion above, these values S1, S2, S3, S4 have successive values that decrease in accordance with the charge sharing characteristics of the circuitry of FIG. 1. It will be understood for this example that the circuitry of FIG. 1 would be modified in accordance with well-known circuit techniques to provide for four signal gains by adding additional feedback capacitors with associated switches (not shown), and the timing diagram of FIG. 2 would include additional signal sampling pulses 9s (not shown).

In conformance with the discussion above, when determining which one or more of the signal samples S1, S2, S3, S4 are to be used in determining the value for the final pixel signal 29 (FIG. 3), one or more of such signal sample values S1, S2, S3, S4 are compared to the criteria established by the higher Th_high and lower Th_low thresholds. It should be understood that references to the thresholds as being "higher" and "lower" are merely used for convenience to indicate that one threshold is "higher" than the other in the sense that such "higher" threshold extends further than the "lower" threshold from the point of reference used. For example, the point of reference would normally be considered to have a null (e.g., zero) value and the "higher" threshold would have a magnitude greater than that of the "lower" threshold, with it being immaterial whether the thresholds themselves were positive or negative in polarity.

The first signal sample S1 is compared to the thresholds 21h, 21l to determine whether such signal sample S1 has a value in region 1, 2 or 3. If this signal sample S1, which has the maximum signal sample value, is in region 1, i.e., is less than the lower threshold, this signal sample S1 provides the basis for the final pixel signal 29. If this signal sample S1 is in region 3, its value is not used in generating the final pixel signal 29. If this signal sample S1 lies in region 2, then it is selectively combined with the value of the next signal sample S2, in conformance with the discussion above. This comparison process is repeated for the remaining signal samples S2, S3, S4 in succession. With respect to the final signal sample S4, in the event that preceding signal sample S3 has a value in region 3, then this last signal sample S4, being the minimum signal sample, is used for generating the final pixel signal 29.

Figure 6:
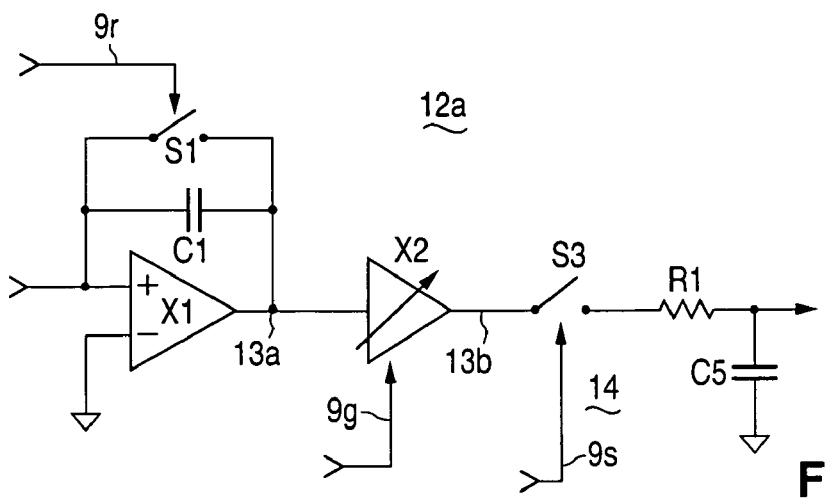
FIG. 6 is a schematic diagram of the linear amplifier portion of a circuit in accordance with an alternative embodiment of the presently claimed invention.

Referring to FIG. 6, in accordance with an alternative embodiment of the presently claimed invention, the input amplifier stage 12a can be implemented such that the charge-to-voltage conversion stage has a single signal gain associated with it. Accordingly, a single feedback capacitance C1 is used (along with a reset switch S1, as discussed above). Variable gain for the stage 12a as a whole is provided by another amplifier X2 having a variable signal gain (many types of which are well known to and readily implemented by one of ordinary skill in the art). The voltage signal 13a is processed by this second amplifier X2 using multiple gain settings for the amplifier X2 according to a gain control signal 9g (e.g., similar to signal 9l). For example, with reference to the timing diagram of FIG. 2, the voltage signal 13a can be processed by the second amplifier X2 using a higher gain setting, with the resulting output signal 13b sampled by the sample and hold circuitry 14. Subsequently, the gain of the second amplifier X2, in accordance with the gain control signal 9g, can be reduced for amplifying the input voltage signal 13a to produce a lower-valued voltage signal 13b for sampling by the sample and hold circuitry 14.

Figure 7:
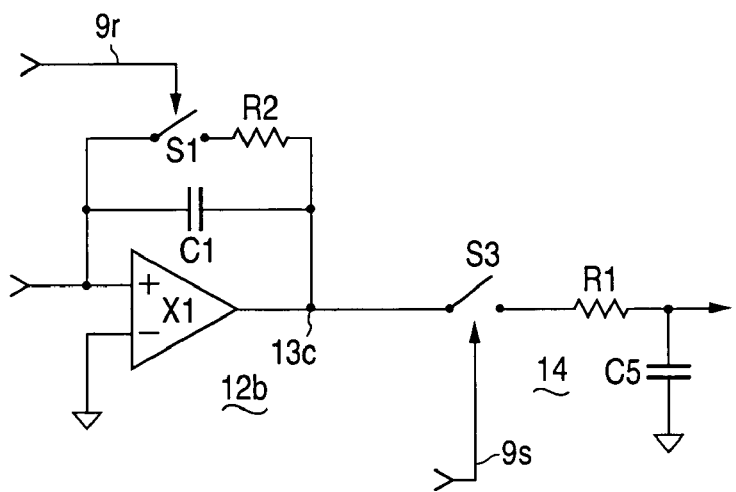
FIG. 7 is a schematic diagram of the linear amplifier portion of a circuit in accordance with another alternative embodiment of the presently claimed invention.

Referring to FIG. 7, another alternative embodiment of the presently claimed invention also has a modified charge-to-voltage conversion circuit 12b. In this embodiment, a single feedback capacitance C1 is used and an additional resistance r2 is placed in series with the reset switch S1. In this embodiment, the gain of the amplifier stage 12b is controlled, i.e., varied, by activating the reset switch S1 for a short time interval (i.e., less time than that needed to fully discharge the capacitance C1) in between the first and second signal sample pulses of the sample control signal 9s (FIG. 2). Accordingly, in the event that the pixel charge acquired prior to the first signal sample pulse causes saturation within the signal path, such interim activation of the reset switch S1, and the resulting discharging of a portion of the charge across capacitance C1 through resistor R2, will reduce the voltage signal 13c enough to avoid saturation of the signal path during the second signal sample pulse of the sample control signal 9s. (Depending upon the desired signal gain, signal sampling rate and dynamic range of the potential pixel charge signal, values for the feedback capacitance C1 and resistor r2 can be readily determined by one of ordinary skill in the art.)

Figure 8:
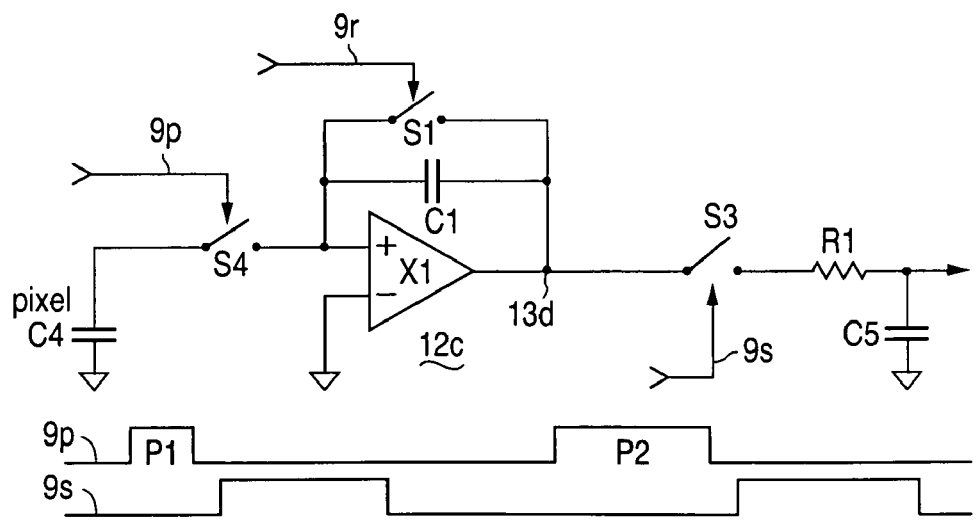
FIG. 8 is a schematic and signal timing diagram of the input circuitry for a circuit in accordance with another alternative embodiment of the presently claimed invention.

Referring to FIG. 8, another alternative embodiment of the presently claimed invention provides for variable gain within the signal path by controlling the amount of electrical charge, i.e., the input signal, acquired from the pixel capacitance C4 prior to the signal sampling pulses of the sampling control signal 9s. For example, the initial pulse P1 of the pixel sampling control signal 9p will have a short pulse duration (i.e., TFT switch s4 is activated, or turned on, for a short time interval), thereby causing only a portion of the pixel charge from capacitance C4 to be shared with capacitance C1 in the amplifier 12c. Accordingly, the initial signal sampling interval would form the low gain mode of operation. The subsequent pixel sampling signal 9p pulse P2 would be of sufficient duration so as to allow for fuller sharing of the pixel charge, thereby causing the mode of operation during the second signal sampling interval to be the high gain mode of operation.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including data signal amplification and processing circuitry with multiple signal gains, comprising:
   a signal node to convey an input signal having an input signal value;
   amplification circuitry coupled to said signal node, including a variable signal gain responsive to at least one gain control signal having a plurality of values, and responsive to said input signal by providing an intermediate signal having a plurality of values corresponding to said plurality of gain control signal values;
   sampling circuitry coupled to said amplification circuitry and responsive to a sampling control signal by sampling said intermediate signal to provide a sample signal having a plurality of values which include at least a maximum and a minimum, and correspond to said plurality of intermediate signal values; and
   processing circuitry coupled to said sampling circuitry and responsive to one or more processing control signals by processing said sample signal to provide a processed signal having a value corresponding to said input signal value, wherein said processed signal value represents
      said maximum sample signal value when said maximum value fails to traverse a predetermined lower threshold,
      said minimum sample signal value when an adjacent larger one of said plurality of sample signal values traverses a predetermined higher threshold,
      a smaller of mutually adjacent ones of a pair of said plurality of sample signal values when a larger one of said pair of sample signal values traverses said predetermined higher threshold and said smaller value fails to traverse said predetermined lower threshold, and
      a combination of said smaller and larger ones of said pair of sample signal values when said larger value traverses said predetermined lower threshold and fails to traverse said predetermined higher threshold.

2. The apparatus of claim 1, wherein said amplification circuitry comprises:
   amplifier circuitry including input and output terminals; and
   a variable feedback capacitance coupled between said amplifier circuitry input and output terminals and responsive to one or more of said at least one gain control signal.

3. The apparatus of claim 1, wherein said amplification circuitry comprises:
   first amplifier circuitry including input and output terminals;
   a feedback capacitance coupled between said first amplifier circuitry input and output terminals; and second amplifier circuitry coupled to said first amplifier circuitry output terminal and having said variable signal gain responsive to said at least one gain control signal.

4. The apparatus of claim 1, wherein said amplification circuitry comprises:
amplifier circuitry including input and output terminals;
a feedback capacitance coupled between said amplifier circuitry input and output terminals; and
switched circuitry coupled across said feedback capacitance and including a resistance and a switch responsive to one or more of said at least one gain control signal.

5. The apparatus of claim 1, wherein:
said input signal has an input signal charge associated therewith; and
said amplification circuitry comprises
capacitive circuitry, and
a switch coupled between said signal node and said capacitive circuitry, and responsive to one or more of said at least one gain control signal by conveying a predetermined portion of said input signal charge to said capacitive circuitry.

6. The apparatus of claim 1, wherein said sampling circuitry comprises:
serial switching circuitry coupled to said amplification circuitry and responsive to said sampling control signal by providing a switched signal path for said intermediate signal; and
shunt capacitive circuitry coupled to said amplification circuitry and responsive to said intermediate signal by charging to provide said sample signal.

7. The apparatus of claim 1, wherein said processing circuitry comprises:
analog-to-digital conversion circuitry responsive to one of said one or more processing control signals by converting said sample signal to provide a digital signal having a plurality of values corresponding to said plurality of sample signal values; and
computational circuitry coupled to said analog-to-digital conversion circuitry and responsive to another one or more of said one or more processing control signals and said digital signal by providing said processed signal.

8. The apparatus of claim 7, wherein said computational circuitry comprises:
comparison circuitry responsive to said digital signal by comparing said plurality of digital signal values to said predetermined lower and higher thresholds; and
combining circuitry responsive to said digital signal by selectively combining first and second ones of said plurality of digital signal values to provide a combination signal corresponding to said combination of said first and second ones of said plurality of sample signal values.

9. An apparatus including data signal amplification and processing circuitry with multiple signal gains, comprising:
amplifier means, including variable signal gain, for receiving an input signal having an input signal value and at least one gain control signal having a plurality of values, and in response thereto generating an intermediate signal having a plurality of values corresponding to said plurality of gain control signal values;
sampling means for receiving a sampling control signal and in response thereto sampling said intermediate signal and generating a sample signal having a plurality of values which include at least a maximum and a minimum, and correspond to said plurality of intermediate signal values; and
processor means for receiving one or more processing control signals and in response thereto processing said sample signal and generating a processed signal having a value corresponding to said input signal value, wherein said processed signal value represents
said maximum sample signal value when said maximum value fails to traverse a predetermined lower threshold,
said minimum sample signal value when an adjacent larger one of said plurality of sample signal values traverses a predetermined higher threshold,
a smaller of mutually adjacent ones of a pair of said plurality of sample signal values when a larger one of said pair of sample signal values traverses said predetermined higher threshold and said smaller value fails to traverse said predetermined lower threshold, and
a combination of said smaller and larger ones of said pair of sample signal values when said larger value traverses said predetermined lower threshold and fails to traverse said predetermined higher threshold.

10. A method of data signal amplification and processing with multiple signal gains, comprising:
receiving an input signal having an input signal value;
receiving at least one gain control signal having a plurality of values;
generating, in response to said input signal and said at least one gain control signal, an intermediate signal having a plurality of values corresponding to said plurality of gain control signal values;
receiving a sampling control signal and in response thereto sampling said intermediate signal and generating a sample signal having a plurality of values which include at least a maximum and a minimum, and correspond to said plurality of intermediate signal values; and
receiving one or more processing control signals and in response thereto processing said sample signal and generating a processed signal having a value corresponding to said input signal value, wherein said processed signal value represents
said maximum sample signal value when said maximum value fails to traverse a predetermined lower threshold,
said minimum sample signal value when an adjacent larger one of said plurality of sample signal values traverses a predetermined higher threshold,
a smaller of mutually adjacent ones of a pair of said plurality of sample signal values when a larger one of said pair of sample signal values traverses said predetermined higher threshold and said smaller value fails to traverse said predetermined lower threshold, and
a combination of said smaller and larger ones of said pair of sample signal values when said larger value traverses said predetermined lower threshold and fails to traverse said predetermined higher threshold.

11. The method of claim 10, wherein said generating, in response to said input signal and said at least one gain control signal, an intermediate signal having a plurality of values corresponding to said plurality of gain control signal values comprises:
controlling a variable feedback capacitance with said at least one gain control signal; and generating said intermediate signal as a function of said input signal and said controlled variable feedback capacitance.

12. The method of claim 10, wherein said generating, in response to said input signal and said at least one gain control signal, an intermediate signal having a plurality of value corresponding to said plurality of gain control signal values comprises:
   generating an initial signal in response to said input signal with first amplifier circuitry including a feedback capacitance; and
   generating said intermediate signal in response to said initial signal with second amplifier circuitry having said variable signal gain responsive to said at least one gain control signal.

13. The method of claim 10, wherein said generating, in response to said input signal and said at least one gain control signal, an intermediate signal having a plurality of values corresponding to said plurality of gain control signal values comprises:
   selectively discharging a feedback capacitance with said at least one gain control signal; and
   generating said intermediate signal as a function of said input signal and said selectively discharged feedback capacitance.

14. The method of claim 10, wherein:
   said input signal has an input signal charge associated therewith; and
   said generating, in response to said input signal and said at least one gain control signal, an intermediate signal having a plurality of values corresponding to said plurality of gain control signal values comprises conveying a predetermined portion of said input signal charge, responsive to one or more of said at least one gain control signal, to capacitive circuitry.

15. The method of claim 10, wherein said receiving a sampling control signal and in response thereto sampling said intermediate signal and generating a sample signal having a plurality of values corresponding to said plurality of intermediate signal values comprises:
   responding to said sampling control signal by providing a switched signal path for said intermediate signal; and
   responding to said intermediate signal by charging shunt capacitive circuitry to provide said sample signal.

16. The method of claim 10, wherein said receiving one or more processing control signals and in response thereto processing said sample signal and generating a processed signal having a value corresponding to said input signal value comprises:
   responding to one of said one or more processing control signals by converting said sample signal to a digital signal having a plurality of values corresponding to said plurality of sample signal values; and
   responding to another one or more of said one or more processing control signals and said digital signal by generating said processed signal.

17. The method of claim 16, wherein said responding to another one or more of said one or more processing control signals and said digital signal by generating said processed signal comprises:
   responding to said digital signal by comparing said plurality of digital signal values to said predetermined lower and higher thresholds; and
   responding to said digital signal by selectively combining first and second ones of said plurality of digital signal values to generate a combination signal corresponding to said combination of said first and second ones of said plurality of sample signal values.

18. An apparatus including data signal amplification and processing circuitry with multiple signal gains, comprising:
   signal acquisition circuitry responsive to an image data signal by providing an acquired data signal;
   amplification circuitry coupled to said signal acquisition circuitry and responsive to at least one gain control signal and said acquired data signal by amplifying said acquired data signal with a plurality of signal gains to produce a corresponding plurality of amplified data signals;
   sampling circuitry coupled to said amplification circuitry and responsive to at least one sampling control signal and said plurality of amplified data signals by sampling said plurality of amplified data signals to produce a corresponding plurality of sampled data signals having a like plurality of values which include at least a maximum and a minimum, and correspond to said plurality of amplified data signals; and
   processing circuitry coupled to said sampling circuitry and responsive to one or more reference signals and one or more of said plurality of sampled data signals by providing a data output signal corresponding to
      said maximum sampled data signal value when said maximum value fails to satisfy a first one of a plurality of criteria related to said one or more reference signals,
      said minimum sampled data signal value when an adjacent larger one of said plurality of sampled data signal values satisfies a second one of said plurality of criteria,
      a smaller of mutually adjacent ones of a pair of said plurality of sampled data signal values when a larger one of said pair of sampled data signal values satisfies said second one of said plurality of criteria and said smaller value fails to satisfy said first one of said plurality of criteria, and
      a combination of said smaller and larger ones of said pair of sampled data signal values when said larger value satisfies said first one of said plurality of criteria and fails to satisfy said second one of said plurality of criteria.

19. The apparatus of claim 18, wherein said amplification circuitry comprises:
   amplifier circuitry including input and output terminals; and
   a variable feedback capacitance coupled between said amplifier circuitry input and output terminals and responsive to one or more of said at least one gain control signal.

20. The apparatus of claim 18, wherein said amplification circuitry comprises:
   first amplifier circuitry including input and output terminals;
   a feedback capacitance coupled between said first amplifier circuitry input and output terminals; and
   second amplifier circuitry coupled to said first amplifier circuitry output terminal and having said variable signal gain responsive to said at least one gain control signal.

21. The apparatus of claim 18, wherein said amplification circuitry comprises:
   amplifier circuitry including input and output terminals;
   a feedback capacitance coupled between said amplifier circuitry input and output terminals; and switched circuitry coupled across said feedback capacitance and including a resistance and a switch responsive to one or more of said at least one gain control signal.

22. The apparatus of claim 18, wherein:
said input signal has an input signal charge associated therewith; and
said amplification circuitry comprises
capacitive circuitry, and
a switch coupled between said signal node and said capacitive circuitry, and responsive to one or more of said at least one gain control signal by conveying a predetermined portion of said input signal charge to said capacitive circuitry.

23. The apparatus of claim 18, wherein said sampling circuitry comprises:
serial switching circuitry coupled to said amplification circuitry and responsive to said sampling control signal by providing a switched signal path for said intermediate signal; and
shunt capacitive circuitry coupled to said amplification circuitry and responsive to said intermediate signal by charging to provide said sample signal.

24. The apparatus of claim 18, wherein said processing circuitry comprises:
analog-to-digital conversion circuitry responsive to one of said one or more processing control signals by converting said sample signal to provide a digital signal having a plurality of values corresponding to said plurality of sample signal values; and
computational circuitry coupled to said analog-to-digital conversion circuitry and responsive to another one or more of said one or more processing control signals and said digital signal by providing said processed signal.

25. The apparatus of claim 24, wherein said computational circuitry comprises:
comparison circuitry responsive to said digital signal by comparing said plurality of digital signal values to said predetermined lower and higher thresholds; and
combining circuitry responsive to said digital signal by selectively combining first and second ones of said plurality of digital signal values to provide a combination signal corresponding to said combination of said first and second ones of said plurality of sample signal values.

26. An apparatus including data signal amplification and processing circuitry with multiple signal gains, comprising:
signal acquisition means for acquiring a data signal;
amplifier means for amplifying said acquired data signal with a plurality of signal gains and generating a corresponding plurality of amplified data signals;
sampling means for sampling said plurality of amplified data signals and generating a corresponding plurality of sampled data signals having a like plurality of values which include at least a maximum and a minimum, and correspond to said plurality of amplified data signals; and
processor means for receiving one or more reference signals, processing one or more of said plurality of sampled data signals and generating a data output signal corresponding to
said maximum sampled data signal value when said maximum value fails to satisfy a first one of a plurality of criteria related to said one or more reference signals,
said minimum sampled data signal value when an adjacent larger one of said plurality of sampled data signal values satisfies a second one of said plurality of criteria,
a smaller of mutually adjacent ones of a pair of said plurality of sampled data signal values when a larger one of said pair of sampled data signal values satisfies said second one of said plurality of criteria and said smaller value fails to satisfy said first one of said plurality of criteria, and
a combination of said smaller and larger ones of said pair of sampled data signal values when said larger value satisfies said first one of said plurality of criteria and fails to satisfy said second one of said plurality of criteria.

27. A method of data signal amplification and processing with multiple signal gains, comprising:
acquiring an image data signal;
amplifying said image data signal with a plurality of signal gains to produce a corresponding plurality of amplified data signals;
sampling said plurality of amplified data signals to produce a corresponding plurality of sampled data signals having a like plurality of values which include at least a maximum and a minimum, and correspond to said plurality of amplified data signals;
comparing one or more of said plurality of sampled data signal values to one or more reference signals; and
providing a data output signal corresponding to
said maximum sampled data signal value when said maximum value fails to satisfy a first one of a plurality of criteria related to said one or more reference signals,
said minimum sampled data signal value when an adjacent larger one of said plurality of sampled data signal values satisfies a second one of said plurality of criteria,
a smaller of mutually adjacent ones of a pair of said plurality of sampled data signal values when a larger one of said pair of sampled data signal values satisfies said second one of said plurality of criteria and said smaller value fails to satisfy said first one of said plurality of criteria, and
a combination of said smaller and larger ones of said pair of sampled data signal values when said larger value satisfies said first one of said plurality of criteria and fails to satisfy said second one of said plurality of criteria.

28. The method of claim 27, wherein said amplifying said image data signal with a plurality of signal gains to produce a corresponding plurality of amplified data signals comprises:
controlling a variable feedback capacitance; and
generating said plurality of amplified data signals as a function of said image data signal and said controlled variable feedback capacitance.

29. The method of claim 27, wherein said amplifying said image data signal with a plurality of signal gains to produce a corresponding plurality of amplified data signals comprises:
generating an initial signal in response to said image data signal with first amplifier circuitry including a feedback capacitance; and
generating said plurality of amplified data signals in response to said initial signal with second amplifier circuitry having said plurality of signal gains.

30. The method of claim 27, wherein said amplifying said image data signal with a plurality of signal gains to produce a corresponding plurality of amplified data signals comprises:
selectively discharging a feedback capacitance; and
generating said plurality of amplified data signals as a function of said image data signal and said selectively discharged feedback capacitance.

31. The method of claim 27, wherein:
said image data signal has a signal charge associated therewith; and
said amplifying said image data signal with a plurality of signal gains to produce a corresponding plurality of amplified data signals comprises conveying a plurality of predetermined portions of said image data signal charge to capacitive circuitry.

32. The method of claim 27, wherein said sampling said plurality of amplified data signals to produce a corresponding plurality of sampled data signals having a like plurality of values which include at least a maximum and a minimum, and correspond to said plurality of amplified data signals comprises:
switching said plurality of amplified data signals; and
charging shunt capacitive circuitry with said switched plurality of amplified data signals to generate said plurality of sampled data signals.

33. The method of claim 27, wherein said comparing one or more of said plurality of sampled data signal values to one or more reference signals comprises comparing one or more of said plurality of sampled data signal values to one or more of a plurality of reference signals corresponding to predetermined lower and higher thresholds.

34. The method of claim 27, wherein said providing a data output signal corresponding to a combination of said smaller and larger ones of said pair of sampled data signal values when said larger value satisfies said first one of said plurality of criteria and fails to satisfy said second one of said plurality of criteria comprises selectively combining a portion said plurality of sampled data signal values.

35. An apparatus including data signal amplifier circuitry with multiple signal gains, comprising:
sampling amplifier circuitry responsive to at least one control signal and an input signal having an input signal value by providing at least one sample signal having a plurality of sample signal values, including maximum and minimum sample signal values, and corresponding to said input signal value; and
processing circuitry coupled to said sampling amplifier circuitry and responsive to said at least one sample signal and one or more processing control signals by processing said at least one sample signal to provide a processed signal having a value corresponding to said input signal value;
wherein said processed signal value represents:
said maximum sample signal value when said maximum value fails to traverse a predetermined lower threshold;
said minimum sample signal value when an adjacent larger one of said plurality of sample signal values traverses a predetermined higher threshold;
a smaller of mutually adjacent ones of a pair of said plurality of sample signal values when a larger one of said pair of sample signal values traverses said predetermined higher threshold and said smaller value fails to traverse said predetermined lower threshold; and
a combination of said smaller and larger ones of said pair of sample signal values when said larger value traverses said predetermined lower threshold and fails to traverse said predetermined higher threshold.

36. An apparatus including data signal amplifier circuitry with multiple signal gains, comprising:
sampling amplifier circuitry responsive to at least one control signal and an input signal having an input signal value by providing at least one sample signal having a plurality of sample signal values, including maximum and minimum sample signal values, and corresponding to said input signal value; and
processing circuitry coupled to said sampling amplifier circuitry and responsive to said at least one sample signal and one or more processing control signals by processing said at least one sample signal to provide a processed signal having a value corresponding to said input signal value;
wherein said processed signal value represents one of a plurality of values which includes
said maximum sample signal value,
said minimum sample signal value,
a first one of said plurality of sample signal values, and
a combination of said first one and a second one of said plurality of sample signal values; and
wherein said sampling amplifier circuitry comprises:
first amplifier circuitry including input and output terminals;
a feedback capacitance coupled between said first amplifier circuitry input and output terminals; and
second amplifier circuitry coupled to said first amplifier circuitry output terminal and having said variable signal gain responsive to at least one of said at least one control signal.

37. An apparatus including data signal amplifier circuitry with multiple signal gains, comprising:
sampling amplifier circuitry responsive to at least one control signal and an input signal having an input signal value by providing at least one sample signal having a plurality of sample signal values, including maximum and minimum sample signal values, and corresponding to said input signal value; and
processing circuitry coupled to said sampling amplifier circuitry and responsive to said at least one sample signal and one or more processing control signals by processing said at least one sample signal to provide a processed signal having a value corresponding to said input signal value;
wherein said processed signal value represents one of a plurality of values which includes
said maximum sample signal value,
said minimum sample signal value,
a first one of said plurality or sample signal values, and
a combination of said first one and a second one of said plurality of sample signal values; and
wherein:
said input signal has an input signal charge associated therewith; and
said sampling amplifier circuitry comprises
a signal node to convey said input signal,
capacitive circuitry, and
a switch coupled between said signal node and said capacitive circuitry, and responsive to one or more of said at least one control signal by conveying a predetermined portion of said input signal charge to said capacitive circuitry.

38. An apparatus including data signal amplifier circuitry with multiple signal gains, comprising:
sampling amplifier circuitry responsive to at least one control signal and an input signal having an input signal value by providing at least one sample signal having a plurality of sample signal values, including maximum and minimum sample signal values, and corresponding to said input signal value; and
processing circuitry coupled to said sampling amplifier circuitry and responsive to said at least one sample signal and one or more processing control signals by processing said at least one sample signal to provide a processed signal having a value corresponding to said input signal value;
wherein said processed signal value represents one of a plurality of values which includes
said maximum sample signal value,
said minimum sample signal value,
a first one of said plurality of sample signal values, and
a combination of said first one and a second one of said plurality of sample signal values; and
wherein said sampling amplifier circuitry comprises:
serial switching circuitry responsive to one of said at least one control signal by providing a switched signal; and
shunt capacitive circuitry coupled to said serial switching circuitry and responsive to said switched signal by charging to provide said at least one sample signal.

39. An apparatus including data signal amplifier circuitry with multiple signal gains, comprising:
sampling amplifier circuitry responsive to at least one control signal and an input signal having an input signal value by providing at least one sample signal having a plurality of sample signal values, including maximum and minimum sample signal values, and corresponding to said input signal value; and
processing circuitry coupled to said sampling amplifier circuitry and responsive to said at least one sample signal and one or more processing control signals by processing said at least one sample signal to provide a processed signal having a value corresponding to said input signal value;
wherein said processed signal value represents one of a plurality of values which includes
said maximum sample signal value,
said minimum sample signal value,
a first one of said plurality of sample signal values, and
a combination of said first one and a second one of said plurality of sample signal values;
wherein said processing circuitry comprises
analog-to-digital conversion circuitry responsive to one of said one or more processing control signals by converting said sample signal to provide a digital signal having a plurality of values corresponding to said plurality of sample signal values, and
computational circuitry coupled to said analog-to-digital conversion circuitry and responsive to another one or more of said one or more processing control signals and said digital signal by providing said processed signal; and
wherein said computational circuitry comprises
comparison circuitry responsive to said digital signal by comparing said plurality of digital signal values to predetermined lower and higher thresholds, and
combining circuitry responsive to said digital signal by selectively combining first and second ones of said plurality of digital signal values to provide a combination signal corresponding to said combination of said first and second ones of said plurality of sample signal values.

40. A method of data signal amplification and processing with multiple signal gains, comprising:
receiving at least one control signal;
receiving an input signal having an input signal value;
generating, in response to said at least one control signal and said input signal, at least one sample signal having a plurality of sample signal values, including maximum and minimum sample signal values, and corresponding to said input signal value; and
receiving one or more processing control signals and in response thereto processing said at least one sample signal and generating a processed signal having a value corresponding to said input signal value;
wherein said processed signal value represents one of a plurality of values which includes
said maximum sample signal value,
said minimum sample signal value,
a first one of said plurality of sample signal values, and
a combination of said first one and a second one of said plurality of sample signal values; and
wherein said processed signal value represents:
said maximum sample signal value when said maximum value fails to traverse a predetermined lower threshold;
said minimum sample signal value when an adjacent larger one of said plurality of sample signal values traverses a predetermined higher threshold;
a smaller of mutually adjacent ones of a pair of said plurality of sample signal values when a larger one of said pair of sample signal values traverses said predetermined higher threshold and said smaller value fails to traverse said predetermined lower threshold; and
a combination of said smaller and larger ones of said pair of sample signal values when said larger value traverses said predetermined lower threshold and fails to traverse said predetermined higher threshold.

41. A method of data signal amplification and processing with multiple signal gains, comprising:
receiving at least one control signal;
receiving an input signal having an input signal value;
generating, in response to said at least one control signal and said input signal, at least one sample signal having a plurality of sample signal values, including maximum and minimum sample signal values, and corresponding to said input signal value, by
generating an initial signal in response to said input signal with first amplifier circuitry including a feedback capacitance, and
generating said at least one sample signal in response to said initial signal with second amplifier circuitry having a variable signal gain responsive to at least one of said plurality control signals; and
receiving one or more processing control signals and in response thereto processing said at least one sample signal and generating a processed signal having a value corresponding to said input signal value;
wherein said processed signal value represents one of a plurality of values which includes
said maximum sample signal value,
said minimum sample signal value, a first one of said plurality of sample signal values, and a combination of said first one and a second one of said plurality of sample signal values.

42. A method of data signal amplification and processing with multiple signal gains, comprising:
receiving at least one control signal;
receiving an input signal having an input signal value, wherein
said input signal has an input signal charge associated therewith;
generating, in response to said at least one control signal and said input signal, at least one sample signal having a plurality of sample signal values, including maximum and minimum sample signal values, and corresponding to said input signal value, by conveying a predetermined portion of said input signal charge, responsive to one or more of said at least one control signal, to capacitive circuitry; and
receiving one or more processing control signals and in response thereto processing said at least one sample signal and generating a processed signal having a value corresponding to said input signal value;
wherein said processed signal value represents one of a plurality of values which includes
said maximum sample signal value,
said minimum sample signal value,
a first one of said plurality of sample signal values, and
a combination of said first one and a second one of said plurality of sample signal values.

43. A method of data signal amplification and processing with multiple signal gains, comprising:
receiving at least one control signal;
receiving an input signal having an input signal value;
generating, in response to said at least one control signal and said input signal, at least one sample signal having a plurality of sample signal values, including maximum and minimum sample signal values, and corresponding to said input signal value, by
responding to one of said at least one control signal by providing a switched signal, and
responding to said switched signal by charging shunt capacitive circuitry to provide said at least one sample signal; and
receiving one or more processing control signals and in response thereto processing said at least one sample signal and generating a processed signal having a value corresponding to said input signal value;
wherein said processed signal value represents one of a plurality of values which includes
said maximum sample signal value,
said minimum sample signal value,
a first one of said plurality of sample signal values, and
a combination of said first one and a second one of said plurality of sample signal values.

44. A method of data signal amplification and processing with multiple signal gains, comprising:
receiving at least one control signal;
receiving an input signal having an input signal value;
generating, in response to said at least one control signal and said input signal, at least one sample signal having a plurality of sample signal values, including maximum and minimum sample signal values, and corresponding to said input signal value; and
receiving one or more processing control signals and in response thereto processing said at least one sample signal and generating a processed signal having a value corresponding to said input signal value, by
responding to one of said one or more processing control signals by converting said at least one sample signal to a digital signal having a plurality of values corresponding to said plurality of sample signal values, and
responding to another one or more of said one or more processing control signals and said digital signal by generating said processed signal, by
responding to said digital signal by comparing said plurality of digital signal values to predetermined lower and higher thresholds, and
responding to said digital signal by selectively combining first and second ones of said plurality of digital signal values to generate a combination signal corresponding to said combination of said first and second ones of said plurality of sample signal values;
wherein said processed signal value represents one of a plurality of values which includes
said maximum sample signal value,
said minimum sample signal value,
a first one of said plurality of sample signal values, and
a combination of said first one and a second one of said plurality of sample signal values.

45. An apparatus including data signal amplifier circuitry with multiple signal gains, comprising:
sampling amplifier circuitry with a plurality of signal gains, including at least maximum and minimum signal gains, and responsive to at least one control signal and an input signal having an input signal value by providing at least one sample signal having a plurality of sample signal values related to said plurality of signal gains, corresponding to said input signal value and including maximum and minimum sample signal values; and
processing circuitry coupled to said sampling amplifier circuitry and responsive to said at least one sample signal and one or more processing control signals by processing said at least one sample signal to provide a processed signal having a value corresponding to said input signal value;
wherein said processed signal value represents
said first value when said maximum sample signal value fails to traverse a predetermined lower threshold,
said second value when an adjacent larger one of said plurality of sample signal values traverses a predetermined higher threshold,
said third value as a smaller of mutually adjacent ones of a pair of said plurality of sample signal values when a larger one of said pair of sample signal values traverses said predetermined higher threshold and said smaller value fails to traverse said predetermined lower threshold, and
said fourth value as a combination of said smaller and larger ones of said pair of sample signal values when said larger value traverses said predetermined lower threshold and fails to traverse said predetermined higher threshold.

46. An apparatus including data signal amplifier circuitry with multiple signal gains, comprising:
sampling amplifier circuitry with at plurality of signal gains, including at least maximum and minimum signal gains, and responsive to at least one control signal and an input signal having an input signal value by providing at least one sample signal having a plurality of sample signal values related to said plurality of signal gains and corresponding to said input signal value; and processing circuitry coupled to said sampling amplifier circuitry and responsive to said at least one sample signal and one or more processing control signals by processing said at least one sample signal to provide a processed signal having a value corresponding to said input signal value;

wherein said processed signal value represents one of a plurality of values which includes
- a first value corresponding to said minimum signal gain,
- a second value corresponding to said maximum signal gain,
- a third value corresponding to a first one of said plurality of signal gains, and
- a fourth value corresponding to a combination of said first one and a second one of said plurality of signal gains; and wherein said sampling amplifier circuitry comprises:
- first amplifier circuitry including input and output terminals;
- a feedback capacitance coupled between said first amplifier circuitry input and output terminals; and
- second amplifier circuitry coupled to said first amplifier circuitry output terminal and having said variable signal gain responsive to at least one of said at least one control signal.

47. An apparatus including data signal amplifier circuitry with multiple signal gains, comprising:

sampling amplifier circuitry with a plurality of signal gains, including at least maximum and minimum signal gains, and responsive to at least one control signal and an input signal having an input signal value by providing at least one sample signal having a plurality of sample signal values related to said plurality of signal gains and corresponding to said input signal value; and processing circuitry coupled to said sampling amplifier circuitry and responding to said at least one sample signal and one or more processing control signals by processing said at least one sample signal to provide a processed signal having a value corresponding to said input signal value;

wherein said processed signal value represents one of a plurality of values which includes
- a first value corresponding to said minimum signal gain,
- a second value corresponding to said maximum signal gain,
- a third value corresponding to a first one of said plurality of signal gains, and
- a fourth value corresponding to a combination of said first one and a second one of said plurality of signal gains;

wherein said input signal has an input signal charge associated therewith; and wherein said sampling amplifier circuitry comprises
- a signal node to convey said input signal,
- capacitive circuitry, and
- a switch coupled between said signal node and said capacitive circuitry, and responsive to one or more of said at least one control signal by conveying a predetermined portion of said input signal charge to said capacitive circuitry.

48. An apparatus including data signal amplifier circuitry with multiple signal gains, comprising:

sampling amplifier circuitry with a plurality of signal gains, including at least maximum and minimum signal gains, and responsive to at least one control signal and an input signal having an input signal value by providing at least one sample signal having a plurality of sample signal values related to said plurality of signal gains and corresponding to said input signal value; and processing circuitry coupled to said sampling amplifier circuitry and responsive to said at least one sample signal and one or more processing control signals by processing said at least one sample signal to provide a processed signal having a value corresponding to said input signal value;

wherein said processed signal value represents one of a plurality of values which includes
- a first value corresponding to said minimum signal gain,
- a second value corresponding to said maximum signal gain,
- a third value corresponding to a first one of said plurality of signal gains, and
- a fourth value corresponding to a combination of said first one and a second one of said plurality of signal gains; and wherein said sampling amplifier circuitry comprises:
- serial switching circuitry responsive to one of said at least one control signal by providing a switched signal; and
- shunt capacitive circuitry coupled to said serial switching circuitry and responsive to said switched signal by charging to provide said at least one sample signal.

49. An apparatus including data signal amplifier circuitry with multiple signal gains, comprising:

sampling amplifier circuitry with a plurality of signal gains, including at least maximum and minimum signal gains, and responsive to at least one control signal and an input signal having an input signal value by providing at least one sample signal having a plurality of sample signal values related to said plurality of signal gains and corresponding to said input signal value; and processing circuitry coupled to said sampling amplifier circuitry and responsive to said at least one sample signal and one or more processing control signals by processing said at least one sample signal to provide a processed signal having a value corresponding to said input signal value;

wherein said processed signal value represents one of a plurality of values which includes
- a first value corresponding to said minimum signal gain,
- a second value corresponding to said maximum signal gain,
- a third value corresponding to a first one of said plurality of signal gains, and
- a fourth value corresponding to a combination of said first one and a second one of said plurality of signal gains;

wherein said processing circuitry comprises
- analog-to-digital conversion circuitry responsive to one of said one or more processing control signals by converting said sample signal to provide a digital signal having a plurality of values corresponding to said plurality of sample signal values, and
- computational circuitry coupled to said analog-to-digital conversion circuitry and responsive to another one or more of said one or more processing control signals and said digital signal by providing said processed signal; and wherein said computational circuitry comprises comparison circuitry responsive to said digital signal by comparing said plurality of digital signal values to predetermined lower and higher thresholds, and combining circuitry responsive to said digital signal by selectively combining first and second ones of said plurality of digital signal values to provide a combination signal corresponding to said combination of said first and second ones of said plurality of sample signal values.

50. A method of data signal amplification and processing with multiple signal gains, comprising:

receiving at least one control signal;

receiving an input signal having an input signal value;

generating, in conformance with a plurality of signal gains, including at least maximum and minimum signal gains, and in response to said at least one control signal and said input signal, at least one sample signal having a plurality of sample signal values related to said plurality of signal gains, corresponding to said input signal value and including maximum and minimum sample signal values; and receiving one or more processing control signals and in response thereto processing said at least one sample signal and generating a processed signal having a value corresponding to said input signal value;

wherein said processed signal value represents said first value when said maximum sample signal value fails to traverse a predetermined lower threshold, said second value when an adjacent larger one of said plurality of sample signal values traverses a predetermined higher threshold, said third value as a smaller of actually adjacent ones of a pair of said plurality of sample signal values when a larger one of said pair of sample signal values traverses said predetermined higher threshold and said smaller value falls to traverse said predetermined lower threshold, and said fourth value as a combination of said smaller and larger ones of said pair of sample signal values when said larger value traverses said predetermined lower threshold and fails to traverse said predetermined higher threshold.

51. A method of data signal amplification and processing with multiple signal gains, comprising:

receiving at least one control signal;

receiving an input signal having an input signal value;

generating, in conformance with a plurality of signal gains, including at least maximum and minimum signal gains, and in response to said at least one control signal and said input signal, at least one sample signal having a plurality of sample signal values related to said plurality of signal gains and corresponding to said input signal value, by generating an initial signal in response to said input signal with first amplifier circuitry including a feedback capacitance, and generating said at least one sample signal in response to said initial signal with second amplifier circuitry having a variable signal gain responsive to at least one of said plurality control signals; and receiving one or more processing control signals and in response thereto processing said at least one sample signal and generating a processed signal having a value corresponding to said input signal value;

wherein said processed signal value represents one of a plurality of values which includes a first value corresponding to said minimum signal gain, a second value corresponding to said maximum signal gain, a third value corresponding to a first one of said plurality of signal gains, and a fourth value corresponding to a combination of said first one and a second one of said plurality of signal gains.

52. A method of data signal amplification and processing with multiple signal gains, comprising:

receiving at least one control signal;

receiving an input signal having an input signal value and an input signal charge associated therewith generating, in conformance with a plurality of signal gains, including at least maximum and minimum signal gains, and in response to said at least one control signal and said input signal, at least one sample signal having a plurality of sample signal values related to said plurality of signal gains and corresponding to said input signal value, by conveying a predetermined portion of said input signal charge, responsive to one or more of said at least one control signal, to capacitive circuitry; and receiving one or more processing control signals and in response thereto processing said at least one sample signal and generating a processed signal having a value corresponding to said input signal value;

wherein said processed signal value represents one of a plurality of values which includes a first value corresponding to said minimum signal gain, a second value corresponding to said maximum signal gain, a third value corresponding to a first one of said plurality of signal gains, and a fourth value corresponding to a combination of said first one and a second one of said plurality of signal gains.

53. A method of data signal amplification and processing with multiple signal gains, comprising:

receiving at least one control signal;

receiving an input signal having an input signal value;

generating, in conformance with a plurality of signal gains, including at least maximum and minimum signal gains, and in response to said at least one control signal and said input signal, at least one sample signal having a plurality sample signal values related to said plurality of signal gains and corresponding to said input signal value, by responding to one of said at least one control signal by providing a switched signal, and responding to said switched signal by charging shunt capacitive circuitry to provide said at least one sample signal; and receiving one or more processing control signals and in response thereto processing said at least one sample signal and generating a processed signal having a value corresponding to said input signal value;

wherein said processed signal value represents one of a plurality of values which includes a first value corresponding to said minimum signal gain, a second value corresponding to said maximum signal gain, a third value corresponding to a first one of said plurality of signal gains, and a fourth value corresponding to a combination of said first one and a second one of said plurality of signal gains.

54. A method of data signal amplification and processing with multiple signal gains, comprising:

receiving at least one control signal;

receiving an input signal having an input signal value;

generating, in conformance wit a plurality of signal gains, including at least maximum and minimum signal gains, and in response to said at least one control signal and said input signal, at least one sample signal having a plurality of sample signal values related to said plurality of signal gains and corresponding to said input signal value; and receiving one or more processing control signals and in response thereto processing said at least one sample signal and generating a processed signal having a value corresponding to said input signal value, by responding to one of said one or more processing control signals by converting said at least one sample signal to a digital signal having a plurality of values corresponding to said plurality of sample signal values, and responding to another one or more of said one or more processing control signals and said digital signal by generating said processed signal, by responding to said digital signal by comparing said plurality of digital signal values to predetermined lower and higher thresholds, and responding to said digital signal by selectively combining first and second ones of said plurality of digital signal values to generate a combination signal corresponding to said combination of said first and second ones of said plurality of sample signal values;

wherein said processed signal value represents one of a plurality of values which includes a first value corresponding to said minimum signal gain, a second value corresponding to said maximum signal gain, a third value corresponding to a first one of said plurality of signal gains, and a fourth value corresponding to a combination of said first one and a second one of said plurality of signal gains.

* * * * *

UNITED STATES PATENT AND TRADEMARK OFFICE
CERTIFICATE OF CORRECTION

| | | |
|---|---|---|
| PATENT NO. | : 7,002,408 B2 | Page 1 of 1 |
| APPLICATION NO. | : 10/685787 | |
| DATED | : February 21, 2006 | |
| INVENTOR(S) | : Pieter Gerhard Roos et al. | |

It is certified that error appears in the above-identified patent and that said Letters Patent is hereby corrected as shown below:

Column 5, line 60, delete "91" and insert --9I--.

Column 6, line 21, delete "91" and insert --9I--.

Column 11, line 30, delete "amplification" and insert --serial switching--.

Column 13, line 13, delete "said" and insert --a--.

Column 14, line 60, delete "said" and insert --a--.

Column 15, line 21, delete "amplification" and insert --serial switching--.

Column 17, line 39, after "portion" and before "said" insert --of--.

Column 23, line 39, delete "responding" and insert --responsive--.

Column 25:
line 37, delete "actually" and insert --mutually--.
line 41, delete "falls" and insert --fails--.

Column 26, line 52, after "plurality" and before "sample" insert --of--.

Signed and Sealed this

Twenty-fifth Day of December, 2007

JON W. DUDAS
*Director of the United States Patent and Trademark Office*